United States Patent [19]
Chkoreff

[11] Patent Number: 5,262,959
[45] Date of Patent: Nov. 16, 1993

[54] REPRESENTATION AND PROCESSING OF HIERARCHICAL BLOCK DESIGNS

[75] Inventor: Lawrence P. Chkoreff, Colorado Springs, Colo.

[73] Assignee: Hewlett-Packard Co., Palo Alto, Calif.

[21] Appl. No.: 624,007

[22] Filed: Dec. 7, 1990

[51] Int. Cl.[5] .............................................. G06F 15/60
[52] U.S. Cl. ...................................... 364/489; 364/488
[58] Field of Search ................ 364/488, 489, 490, 491

[56] References Cited

U.S. PATENT DOCUMENTS

| | | | |
|---|---|---|---|
| 4,638,442 | 1/1987 | Bryant et al. | 364/489 |
| 4,703,435 | 10/1987 | Darringer et al. | 364/489 |
| 4,831,543 | 5/1989 | Mastellone | 364/489 |
| 4,833,619 | 5/1989 | Shimizu et al. | 364/489 |
| 4,918,614 | 4/1990 | Modarres et al. | 364/490 |
| 4,967,367 | 10/1990 | Piednoir | 364/489 |
| 5,065,355 | 11/1991 | Hayase | 364/491 |
| 5,095,441 | 3/1992 | Hopper et al. | 364/489 |
| 5,150,308 | 9/1992 | Hooper et al. | 364/489 |

OTHER PUBLICATIONS

"Hierarchical Logic Synthesis System for VLSI" by Matsumoto et al., IEEE Proceeding of ISCAS 85, 1985, pp. 651-654.

Primary Examiner—Vincent N. Trans

[57] ABSTRACT

The disclosed invention is a method of determining one or more parameters associated with the hierarchical circuit design. The method comprises the step of: (a) constructing a data structure representing the hierarchical circuit design; (b) synthesizing a list of attributes associated with each block in the design, the synthesis starting at the lowest level nonleaf blocks in the hierarchy and proceeding through all higher level blocks in the design; and (c) based upon the list of attributes determining in the step (b), analyzing the data structure and determining the parameter. One of the parameters determined is the delay associated with each leaf component.

43 Claims, 17 Drawing Sheets

FOR OUTPUT PIN Y:

- CI = MAX. INPUT CAPACITANCE = 34
- CO = OUTPUT CAPACITANCE = 21
- A = DELAY PARAMETER A = 5
- B = DELAY PARAMETER B = 7

- X = OUTPUT DELAY =
  $A \cdot CO + B \cdot CI$ = 343

FOR OUTPUT PIN Y:

- CI = MAX. INPUT CAPACITANCE = 13
- CO = OUTPUT CAPACITANCE = 15
- A = DELAY PARAMETER A = 3
- B = DELAY PARAMETER B = 5

- X = OUTPUT DELAY =
  $A \cdot CO + B \cdot CI$ = 110

REPRESENTATION AND PROCESSING OF HIERARCHICAL BLOCK DESIGNS

FIELD OF THE INVENTION

The invention is related to the field of computer aided electronic circuit design. More particularly, the invention is related to methods of logically representing and processing hierarchical circuit designs.

BACKGROUND OF THE INVENTION

An important aspect of computer aided electronic design is that it provides the designer a means for predicting various performance parameters of the circuit being designed prior to the circuits actually being built. An example of a parameter whose value should be estimated prior to completing the design of a digital circuit is the delay associated with the components (or "blocks") of the circuit. Typically, digital circuit designs are "hierarchical" in that they consist of functional components ("leaf blocks") which compose intermediate level blocks, which in turn compose higher level blocks, and so on. For example, it is well known that a four-bit adder comprises four full adder blocks; which comprise two half adder blocks each; which comprise NAND and INVERTER leaf blocks.

In order to analyze such a design, the design must first be logically represented, or modeled, in the computer. This logical representation is provided by a "data structure". Typically, a delay estimator algorithm traverses the design hierarchy, builds a flattened data structure, and then performs delay computations. A disadvantage with building a flattened data structure is that the data structure becomes extremely large for practical circuits. In addition, building a flattened data structure increases the complexity of the algorithm.

It is therefore an object of the present invention to provide a comparatively simple data structure for logically representing a hierarchical circuit design. It is a further object of the present invention to provide a method of using such a simplified data structure in analyzing the circuit design. The present invention achieves these objectives.

SUMMARY OF THE INVENTION

The present invention comprises two main aspects. The first aspect of the invention is a data structure for logically representing a hierarchical circuit design. The hierarchical circuit comprises at least one nonleaf component, wherein a nonleaf component is ultimately composed of one or more leaf components.

A data structure according to the invention comprises a block of data for each nonleaf component. Each block of data comprises: (a) a list of ports of the nonleaf component; (b) a list of components comprising the nonleaf component, the list of components being partitioned into "types", each type being indicative of the function performed by the component(s) associated therewith; and (c) a list of ports associated with the components comprising the nonleaf component, the list of ports being partitioned into classes representing nets to which the ports are connected. A preferred embodiment of the data structure further comprises a list of types indicative of the function of the components comprising the nonleaf block.

A second main aspect of the invention is a method of determining one or more parameters associated with the hierarchical circuit design. The method comprises the steps of: (a) constructing a data structure (as described above) representing the hierarchical circuit design; (b) synthesizing a list of attributes associated with each block in the design, the synthesis starting at the lowest level nonleaf blocks in the hierarchy and proceeding through all higher level blocks in the design; and (c) based upon the list of attributes determined in step (b), analyzing the data structure and determining the parameter. In a preferred embodiment of the invention, one of the parameters determined is the delay associated with each leaf component.

DETAILED DESCRIPTION OF THE PREFERRED EMBODIMENTS

The preferred embodiments of the invention will now be described with reference to the drawings, wherein like numerals designate like elements or steps. First a data structure for representing a hierarchical circuit design according to the invention will be described. Next, a method of using the data structure to predict the output delay associated with the circuit blocks will be described. The method of using the data structure will be explained by working through an example of estimating the delay associated with the various components of a digital four bit adder circuit. Such an estimation is useful for predicting the performance of a proposed design based upon the data structure supplied by the user in accordance with the invention.

Figure 2:
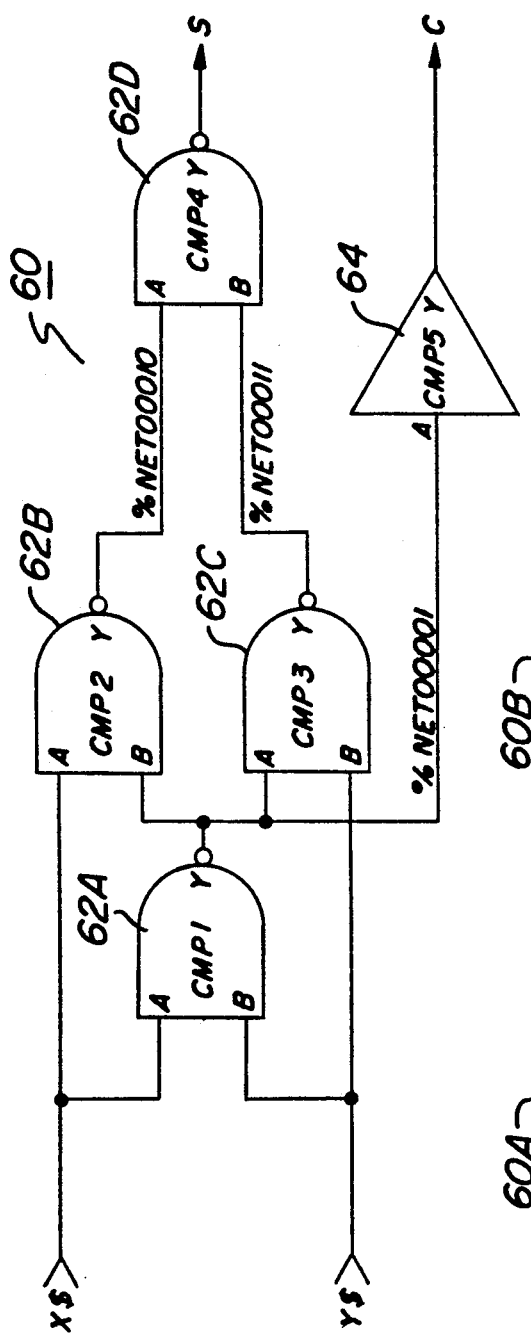
FIGS. 2-5 are schematic diagrams of a HALF ADDER, FULL ADDER, FOUR BIT ADDER, and ROOT blocks, respectively, of an exemplary hierarchical circuit design.
Figure 3:
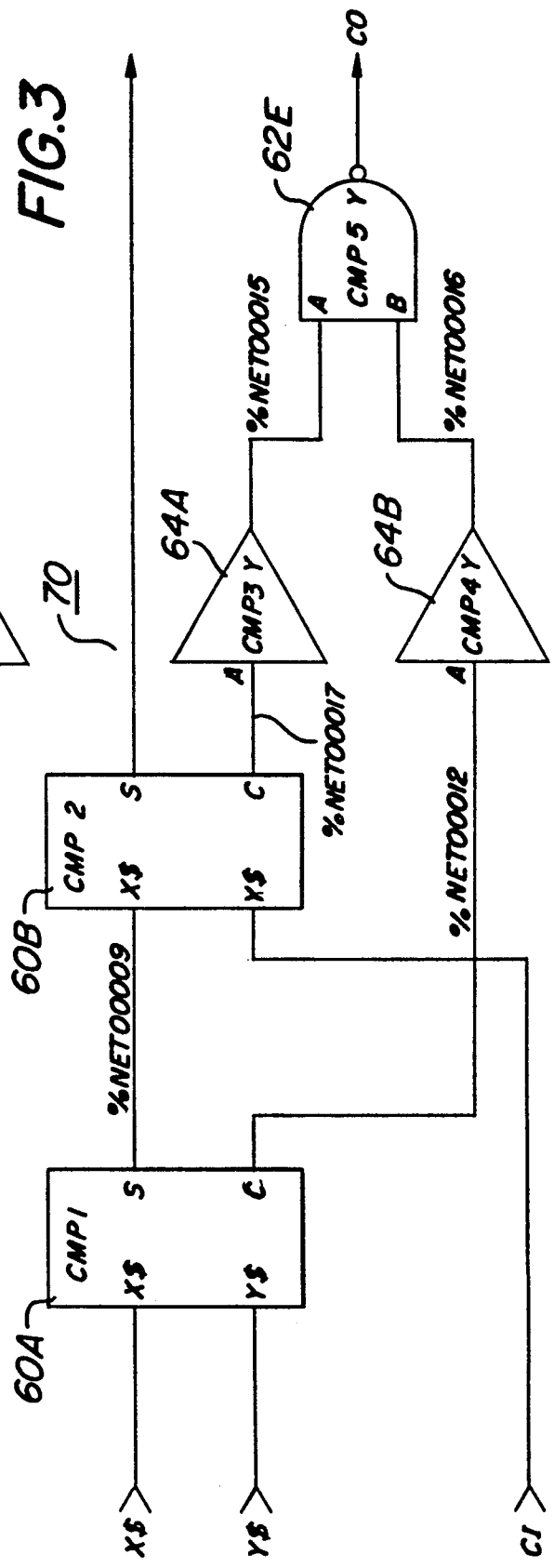
Figure 4:
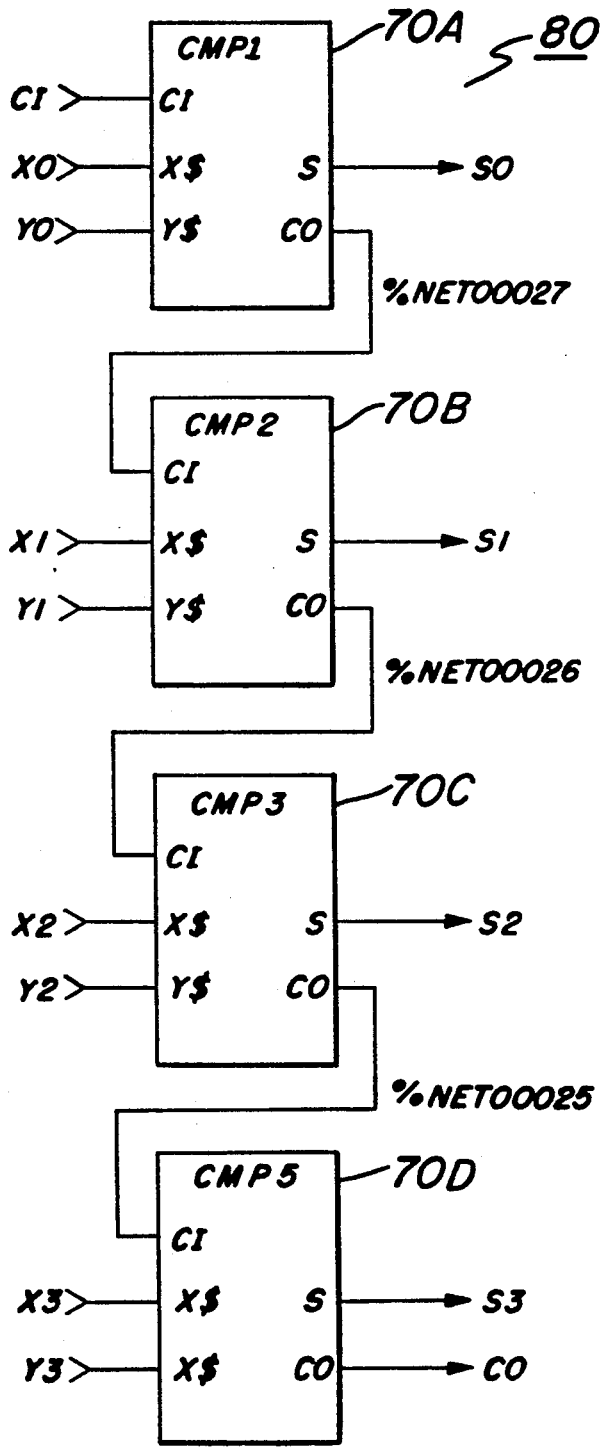
Figure 5:
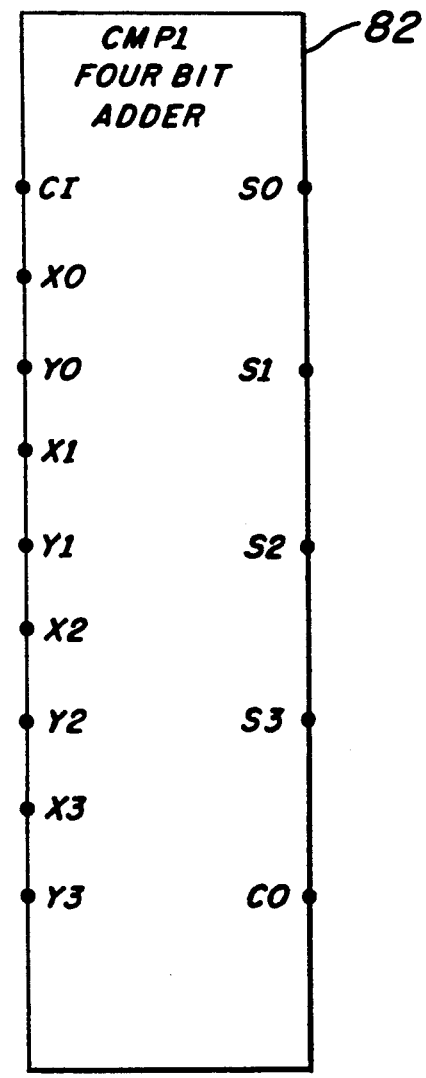

FIGS. 2 through 4 represent, respectively, the "HALF ADDER" 60, "FULL ADDER" 70, and "FOUR BIT ADDER" 80 blocks of a hierarchical design of a four bit adder circuit. FIG. 5 represents the "ROOT" block 82 which is essentially the same as the FOUR BIT ADDER block 80 but is defined separately for reasons which will become clear. It should be apparent that the HALF ADDER block 60 is the lowest level nonleaf block in the design hierarchy. ROOT block 82 is the highest level block in the hierarchy. All nonleaf blocks are ultimately defined in terms of leaf blocks.

As used herein, the term "net" refers to a node or connecting point between two or more components. There are two kinds of nets: (1) external nets of a block are the input and output ports of that block, e.g., "X$", "Y$", "S", and "C" are the external nets (ports) of HALF ADDER block 60; (2) internal nets are the nodes within a block, e.g., "%NET00001", "%NET00010", and "%NET00011" are the internal nets of HALF ADDER block 60.

The NAND leaf blocks 62A, 62B, 62C, 62D and INVERTER block 64 of FIG. 2 have the following attributes (data) associated with them:

```
NAND: Gate Count = 2
    Pin Capacitance (pin A) = 3
    Pin Capacitance (pin B) = 2
    Pin Capacitance (pin Y) = 1
    Delay parameter A (pin Y) = 5
    Delay parameter B (pin Y) = 7
INVERTER: Gate Count = 1
    Pin Capacitance (pin A) = 1
    Pin Capacitance (pin Y) = 1
    Delay parameter A (pin Y) = 3
    Delay parameter B (pin Y) = 5
```

For the purposes of illustrating the invention, the output delay is defined as $A \times C_o + B \times C_i$, where $C_o$ is the capacitance of the net connected to the output port, and $C_i$ is the maximum capacitance of any net connected to an input port. This definition of output delay is intended to illustrate a method according to the invention of determining and utilizing attributes associated with the blocks and nets of the design in order to estimate some performance parameter (e.g., output delay). The equations used herein are therefore not intended to limit the scope of the invention, which is defined in the appended claims.

A. Data Structure

According to the invention, a data structure representing a hierarchical circuit design comprises a list of blocks. Each block has associated with it: (1) a list of "types" representing the kinds of components contained within the block; (2) a list of "instances" identifying the particular components within the block (e.g., in FIG. 2 the NAND block 62A is identified as instance "CMP1"); and (3) a list of ports associated with the block (e.g., block 62A (CMP1) has the ports "X$", "Y$", "S" and "C" associated with it).

In order to avoid the creation of circular hierarchies, each type is associated with a subsequent block in the design. In addition, the instances are "partitioned" into the types referenced by the block. Finally, each instance has a list of connections (instance ports). The entire list of connections for all instances is partitioned into nets.

The following table shows the list for representing the HALF ADDER block of FIG. 2.

```
Lists for HALF ADDER Block
Ports: X$, Y$, S, C
Type:                NAND
INVERTER
Instances: ((CMP1, CMP2, CMP3, CMP4,) (CMP5))
Instance Ports:   CMP1: A -- X$
                        B -- Y$
                        Y -- %NET0001
                  CMP2: A -- X$
                        B -- %NET0001
                        Y -- %NET00010
                  CMP3: A -- %NET0001
                        B -- Y$
                        Y -- %NET00011
                  CMP4: A -- %NET00010
                        B -- %NET00011
                        Y -- S
                  CMP5: A -- %NET0001
                        Y -- C
```

According to the invention, there would be similar lists for representing the FULL ADDER block 70, FOUR BIT ADDER block 80, and ROOT block 82. Next, a data structure according to the present invention for representing the four bit adder design of FIGS. 2–5 will be described in greater detail.

1. Hierarchy

Figure 6:
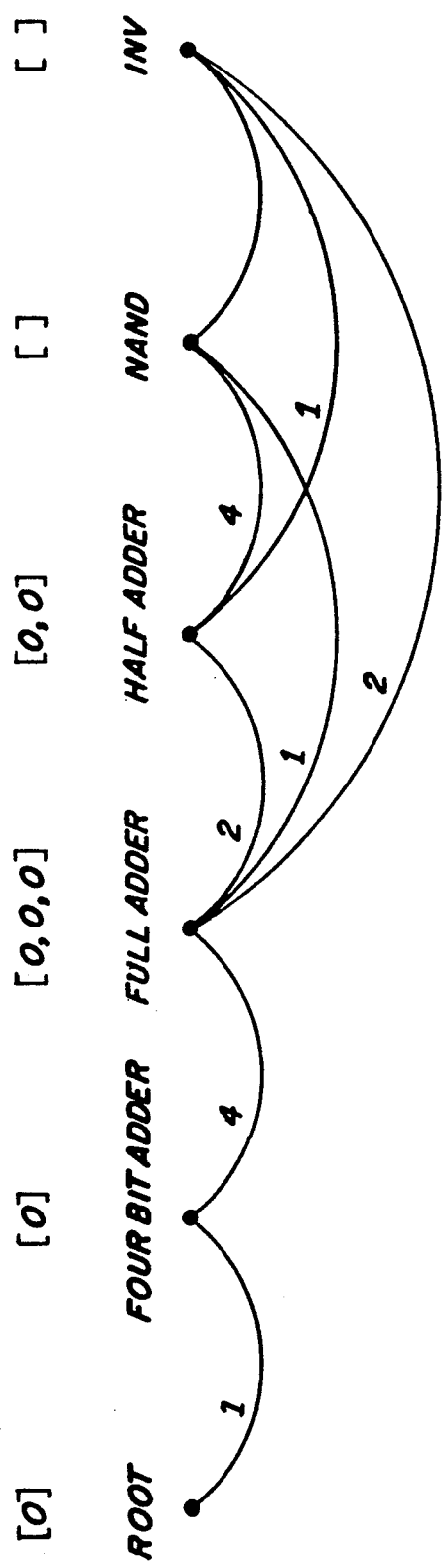
FIGS. 6-8 are graphical representations of a data structure representing the circuit of FIGS. 2-5.

The design hierarchy is represented by the directed acrylic graph shown in FIG. 6. Each vertex of the graph represents a block in the design. Each edge from one vertex to another (e.g., X to Y) is labeled with a positive integer N and represents the fact that block X contains exactly N instances of block Y. An edge from X to Y means that block X uses block Y.

The directed acrylic graph can be represented by a list of vertices, where each vertex is represented by a list of edges. Each edge from a vertex X has associated with it a natural number which denotes the offset of the destination vertex Y relative to the destination of the previous edge, or relative to X for the first edge. Edges always proceed from left to right. Each vertex is marked with a list of numbers denoting the offsets for the list of edges emanating from that vertex.

For each block in the hierarchy, there is a set of components which is partitioned into types. In the context of the invention, the concept of a partitioned set is particularly important since it is also used for representing connectivity.

Figure 7:
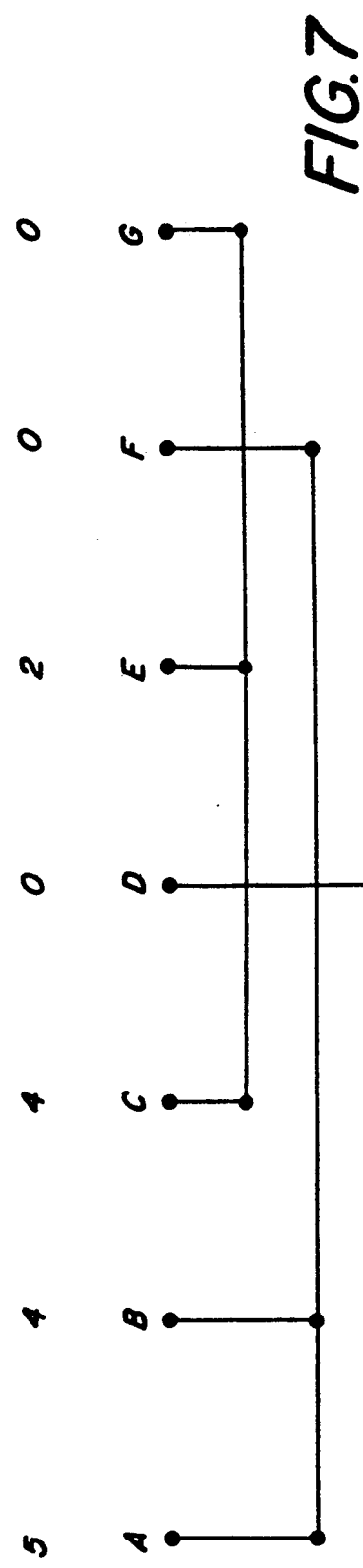

As an example, the set [a,b,c,d,e,f,g,] can be partitioned into the set of classes [[d],[f,b,a],[g,e,c]]. In this situation, the elements d, f, and g are the representative elements of the three respective classes. FIG. 7 shows a diagram of this particular partitioning of 7 elements. Above each element is its index number. The index number is 0 if the element is a representative of a class, otherwise it is a positive integer denoting the relative position of the representative of the class to which the element is connected. Thus, this partitioned set is represented by the list of natural numbers [5,4,4,0,2,0,0]. According to the invention, a set of components for a block is simply a partitioned set of elements, where each element represents a component and each class represents a type. Each component is an instance of the block associated with the local type to which it belongs.

2. Connectivity

For each instance of a block there is a distinct set of component ports, or connections, which correspond to the interface of that block. For example, each instance of HALF ADDER 60 (e.g., block 60A) has a set of 4 component ports (XS, YS, S, C) corresponding to the interface of the block with surrounding components. The FULL ADDER block 70 has a total of 15 connections distributed among its 5 components. These 15 connections are connected into a no particular topology of 10 nets: the 5 internal nets, "%NET00009", "%NET00012", "%NET00017", "%NET00015", and "%NET00016"; and the 5 external nets "X", "Y", "CI", "S", and "CO".

For each block in the hierarchy, there is an associated connectivity object. The connectivity object is a partitioned set of elements, where each element represents an instance port and each class represents a net. Thus, every instance port is connected to exactly one net, and every net contains at least one instance port.

Figure 8:
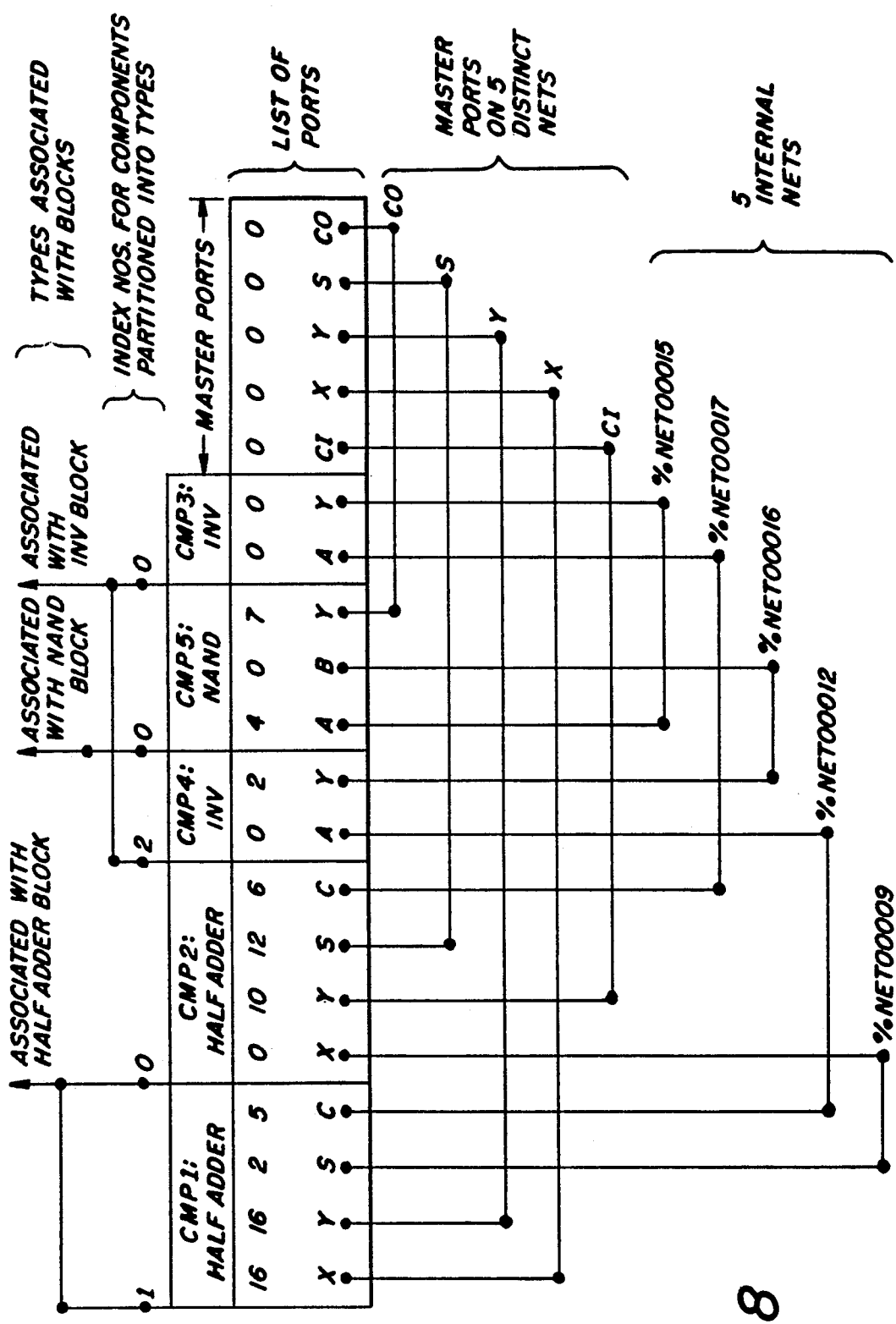

The connectivity for FULL ADDER block 70 is a set of 15 connections which is partitioned into 10 nets. FIG. 8 shows the complete data structure for FULL ADDER block 70. The set of components is partitioned into local types. The ports of these components are flattened into the list of connections. Finally, the connections are partitioned into nets. Note that each external net is represented by a distinct "dummy connection". These 5 dummy connections correspond to the master ports of FULL ADDER block 70. The other 15 connections correspond to the component ports within FULL ADDER 70.

B. Algorithm

Figure 1A:
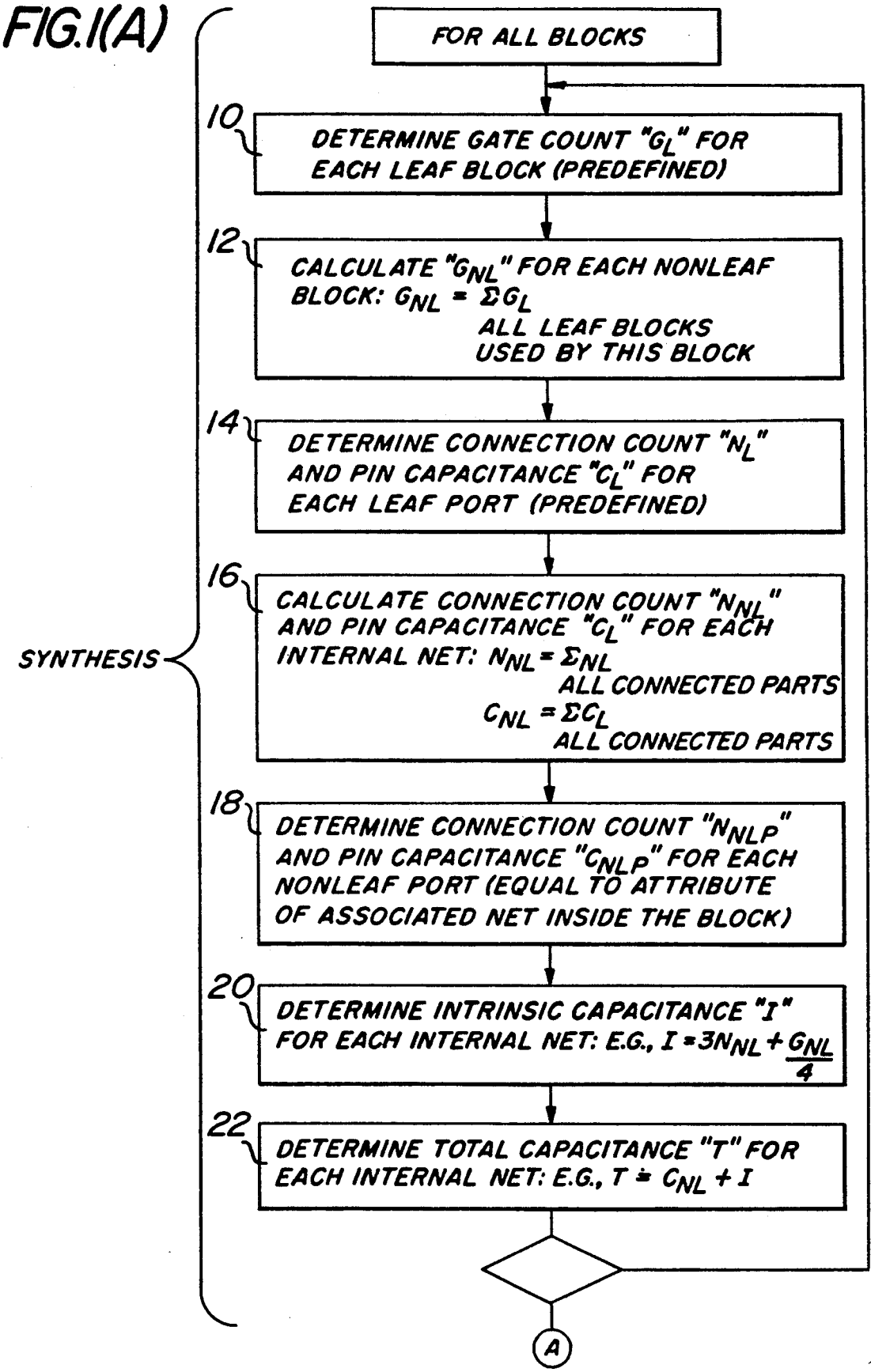
FIGS. 1(A)-(C) are a flowchart of a preferred represented by a data structure according to the invention.
Figure 1B:
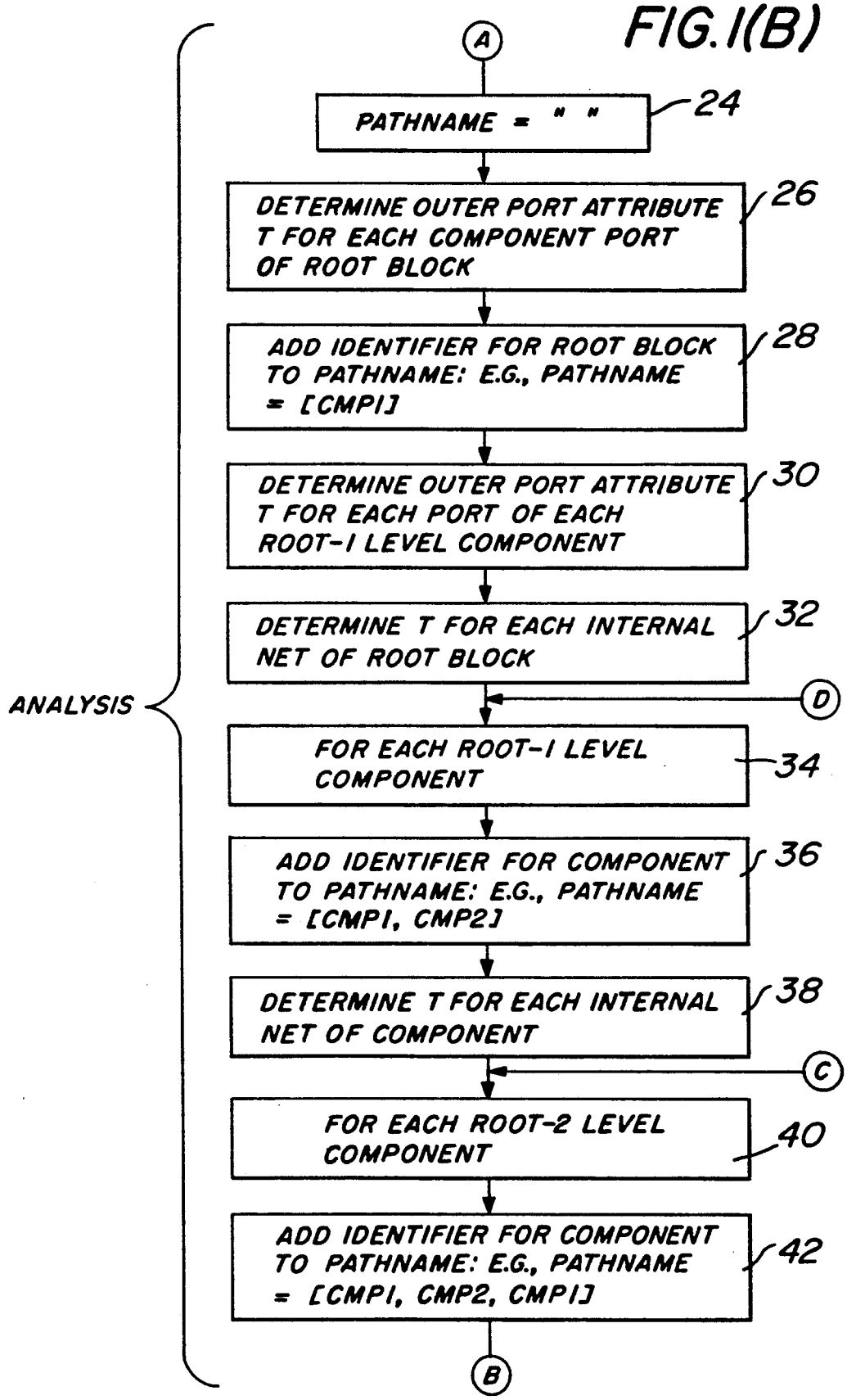
Figure 1C:
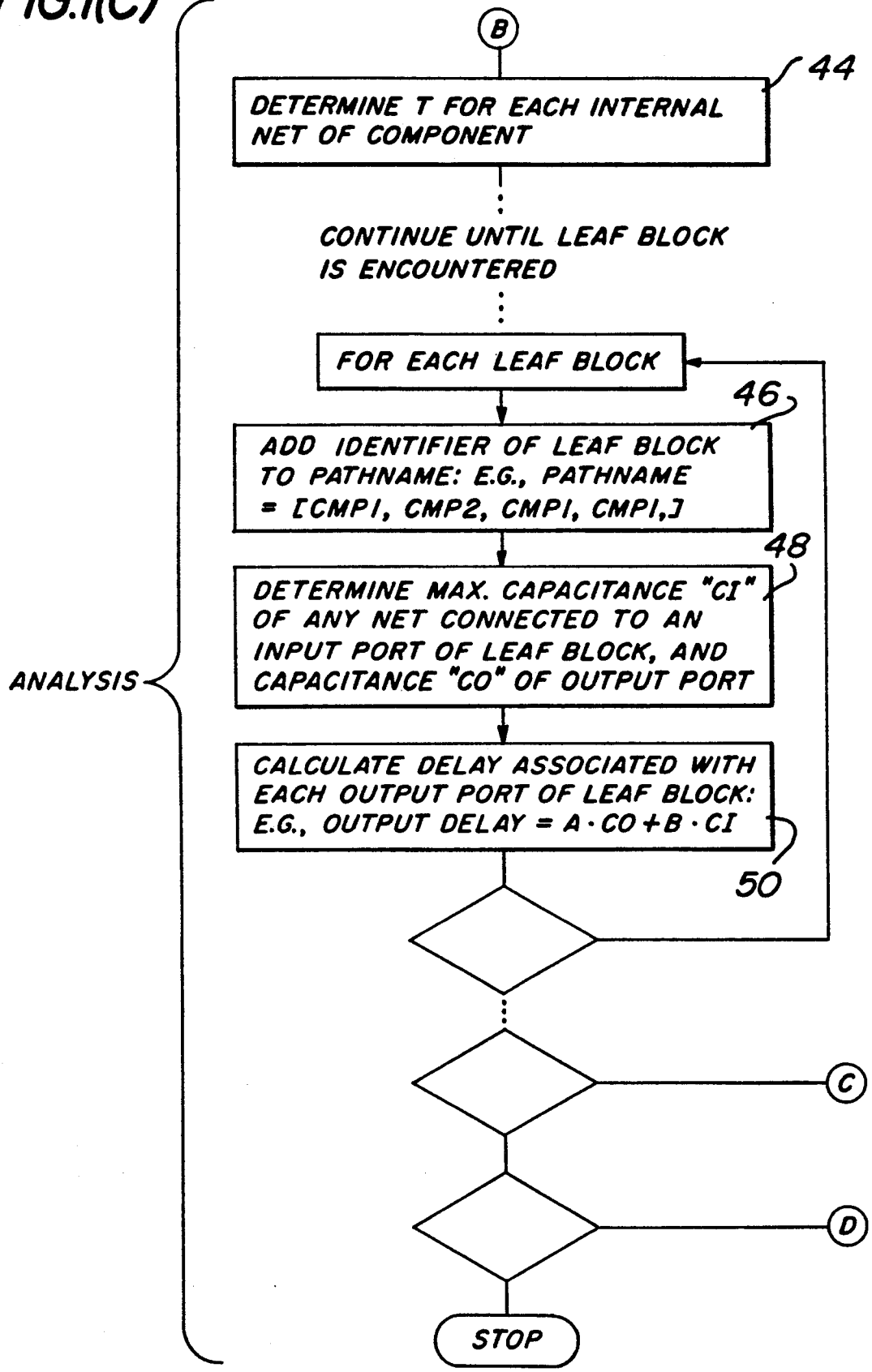

Before proceeding with an example demonstrating how to use the data structure to calculate delay, the algorithm will first be summarized with reference to FIGS. 1(A)–(C). The algorithm comprises two parts-synthesis and analysis. Synthesis (blocks 10 to 22) is performed for each nonleaf block in a bottom-up order: that 10 is, a block must be processed before any block of which it is a component. For the example, the order is: HALF ADDER, FULL ADDER, FOUR BIT ADDER, and ROOT.

First, the gate counts ("$G_L$") are determined for each leaf block within the block being processed, step 10. As discussed above, the $G_L$s for the leaf blocks are predefined by the user. Next, the gate counts ("$G_{NL}$") are calculated for the block being processed, step 12. According to the invention, the gate count attributes $G_{NL}$ of a nonleaf block is equal to the sum of the gate count attributes of all the components (blocks)within that block.

Next, the connection count attribute ("$N_L$") and pin capacitance attribute ("$C_L$") are determined for each leaf port with the block being processed, step 14. As discussed above, the pin capacitance associated with all leaf ports is predefined by the user. According to the invention, the connection count $N_L$ of any leaf is defined to be one (1).

Next, the connection count attribute ("$N_{NL}$") and pin capacitance attribute ("$C_{NL}$") of all internal nets are calculated, step 16. According to the invention, the attribute of an internal net is equal to the sum of the attributes of all ports connected to that net. Next, at step 18, the connection count ("$N_{NLP}$") and pin capacitance ("$C_{NLP}$") for each nonleaf port within the block being processed are determined. The attribute of a nonleaf port is equal to the attribute of the internal net connected to that port.

Next, the intrinsic capacitance ("I") and total capacitance ("T") associated with each internal net are determined, steps 20 and 22 respectively. In the example which follows, I is defined by the equation:

$$I = 3 \times N_{NL} + \frac{G_{NL}}{4}$$

and T is defined by:

$$T = C_{NL} + I.$$

(As before, the invention is not limited to these particular equations for calculating I and T.) This concludes the summary of the synthesis portion of the algorithm. The analysis portion will be described next with reference to FIGS. 1(B) and 1(C). A detailed example will follow.

Referring now to FIG. 1(B), the analysis proceeds in a top-down order in order to compute component-specific information. The analysis starts at the root block level of the design hierarchy and ends by computing particular parameters (e.g., output port delay) associated with the leaf blocks. A "pathname" is constructed to track the sequence of components traversed in reaching the particular block being processed. Thus, the first step is to assign the pathname the null sequence, step 24.

Next, the appropriate attribute(s) (T in the example below) are determined for each outer port of the root block, step 26. According to the invention, an attribute associated with an outer port of a block is defined as follows: If the port is connected to an internal net, then the associated attribute is equal to the attribute associated with the net. If the port is connected to an external net, then its associated attribute is equal to the attribute of the external net. In this way, net attributes (such as T) are passed down through the ports to which they are connected.

Next, as processing continues to the next lower, or "root-1", level of the design hierarchy, the identifier for the root block (e.g., "CMP1" in FIG. 5) is appended to the pathname, step 28. Next, the outer port attribute for each port of each root-1 level component is determined, step 30.

Next, the attribute is determined for each internal net of the root block. (Note that an internal net of the root block is, by definition, an external net with respect to a component block of the root block).

Next, each component block of the root block is processed in a fashion similar to that described above for the root block. See steps 34 to 38. Similarly, as components of components of the root block are encountered, these too are processed, and so on, until a leaf block is encountered. When a leaf block is encountered, $C_i$ and $C_o$ for that leaf is determined, step 48, and the parameter of interest (e.g., output port delay) is calculated, step 50. This concludes the analysis portion of the algorithm.

A detailed example will now be presented in order to further elucidate the invention.

EXAMPLE

In the following example all quantities are calculated as an integer number of standard physical units. (Actual units are irrelevant for our purposes and are therefore not specified.) The example will illustrate how, according to the invention, pin capacitances are determined for all ports (i.e., input and output terminals) of all components of the circuit design shown in FIGS. 2 through 5. The pin capacitances are used to calculate the delay associated with the respective output ports of all leaf blocks. As mentioned above, the term "leaf block" (or "leaf component") as used herein is defined as a block whose internal structure is unspecified; i.e., a block that is specified as a function only. In FIG. 2 for example, the NAND blocks 62A-D and INVERTER block 64 ar leaf blocks. Leaf blocks have ports but no internal structure.

A. Synthesis

1. Gate Counts

Figure 9:
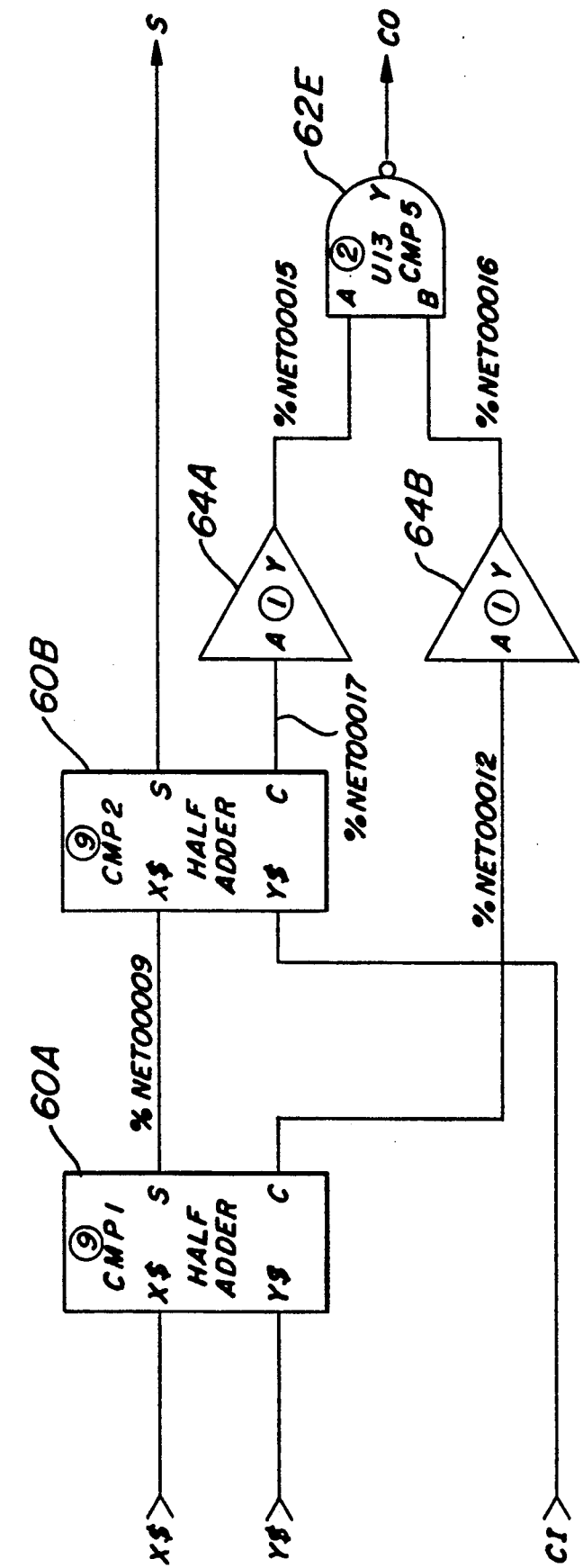
FIGS. 9-20 illustrate successive stages of a method, according to the invention, of processing a data structure representing the circuit of FIGS. 2-5 to determine the output pin delay associated with the circuit components.
Figure 10:
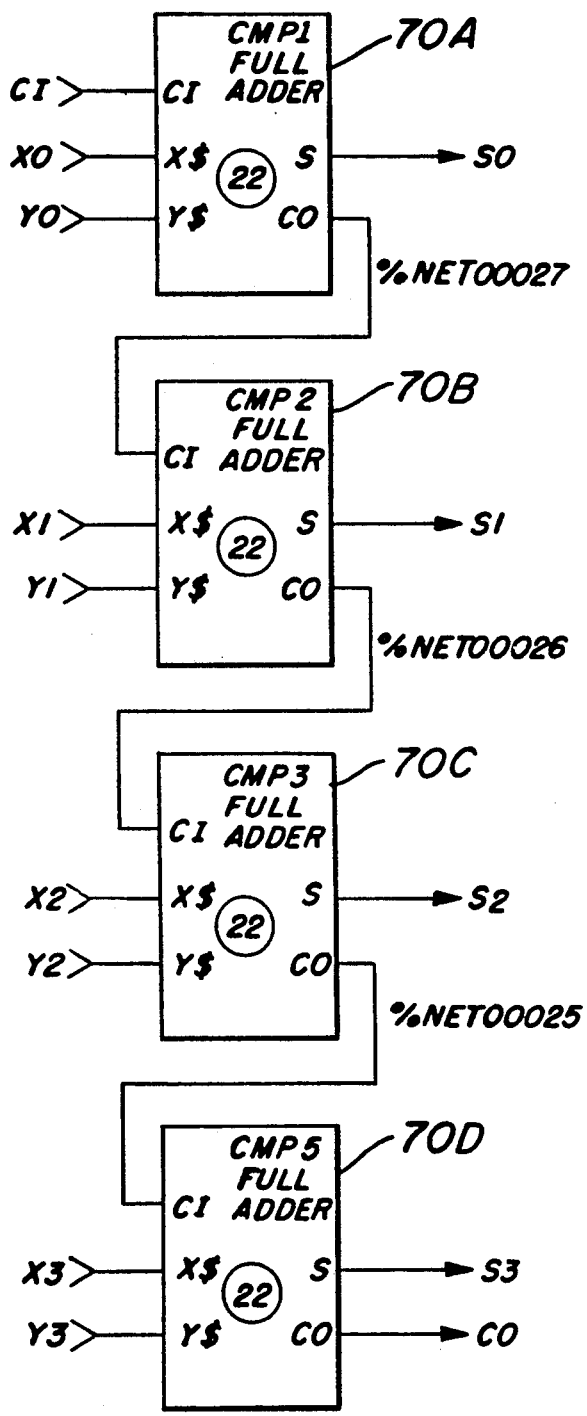
Figure 11:
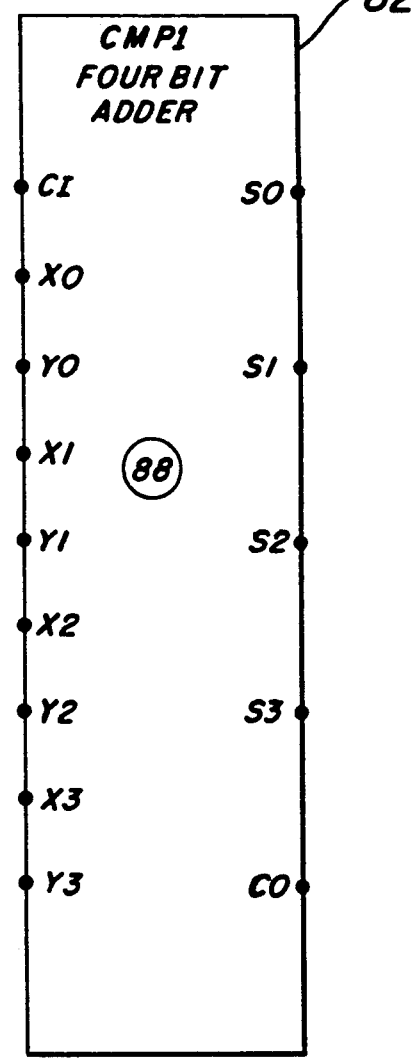

The gate counts of the leaf blocks NAND and INVERTER were defined above. In FIG. 9, the components of FULL ADDER block 70 are labeled with their gate counts. The total gate count of HALF ADDER 60 is $2+2+2+2+1=9$. Note that the two HALF ADDER instances 60A, 60B are labeled with a "9", which we just computed. In FIG. 10, the components of the FOUR BIT ADDER block 80 are labeled with their gate counts. The total gate count of FULL ADDER is $9+9+1+1+2=22$. Similarly, the gate count is 88 for FOUR BIT ADDER 80 in FIG. 10, and also 88 for ROOT block 82 in FIG. 12.

2. Pin Capacitance and Connection Counts

Figure 12:
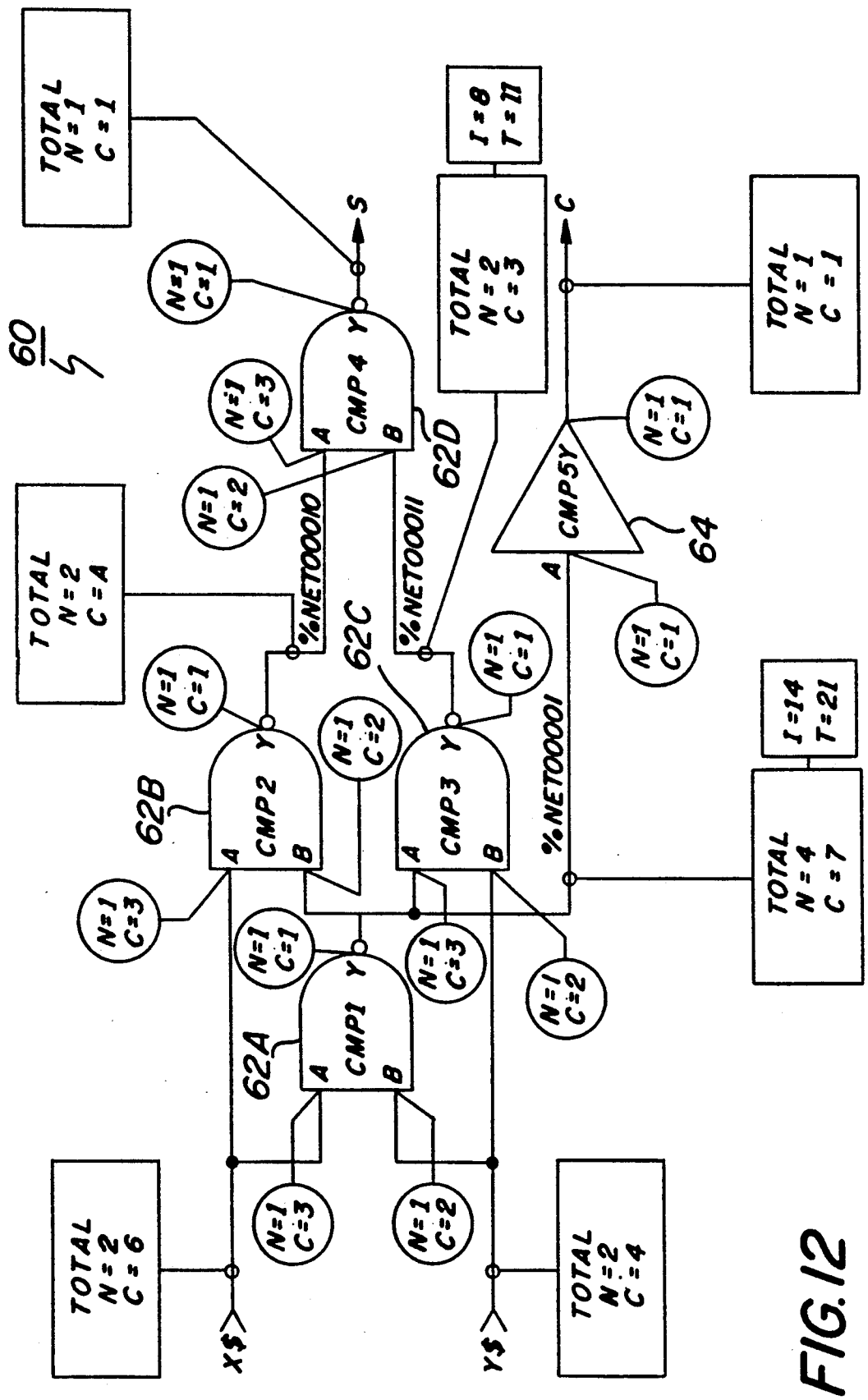
Figure 13:
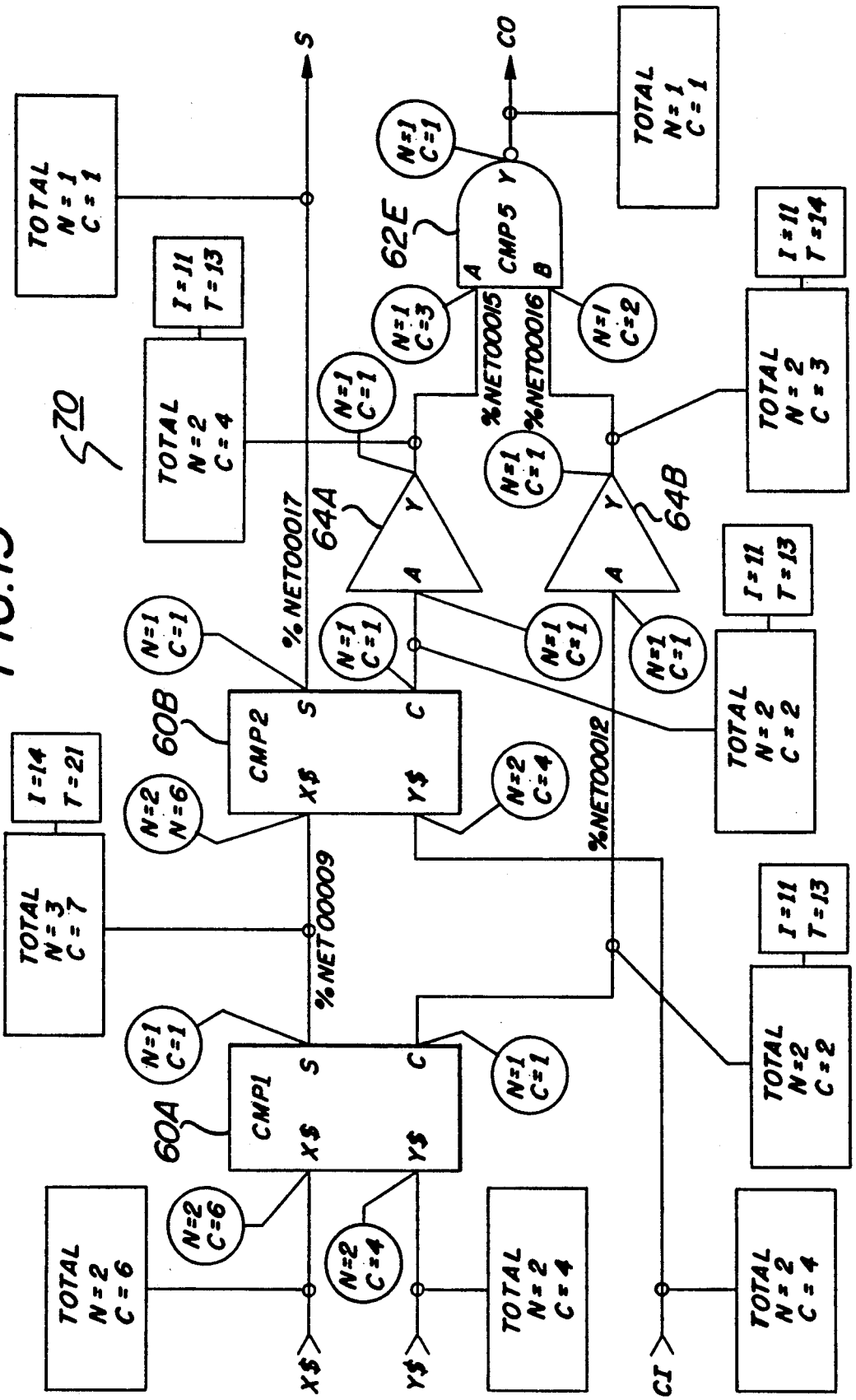
Figure 14:
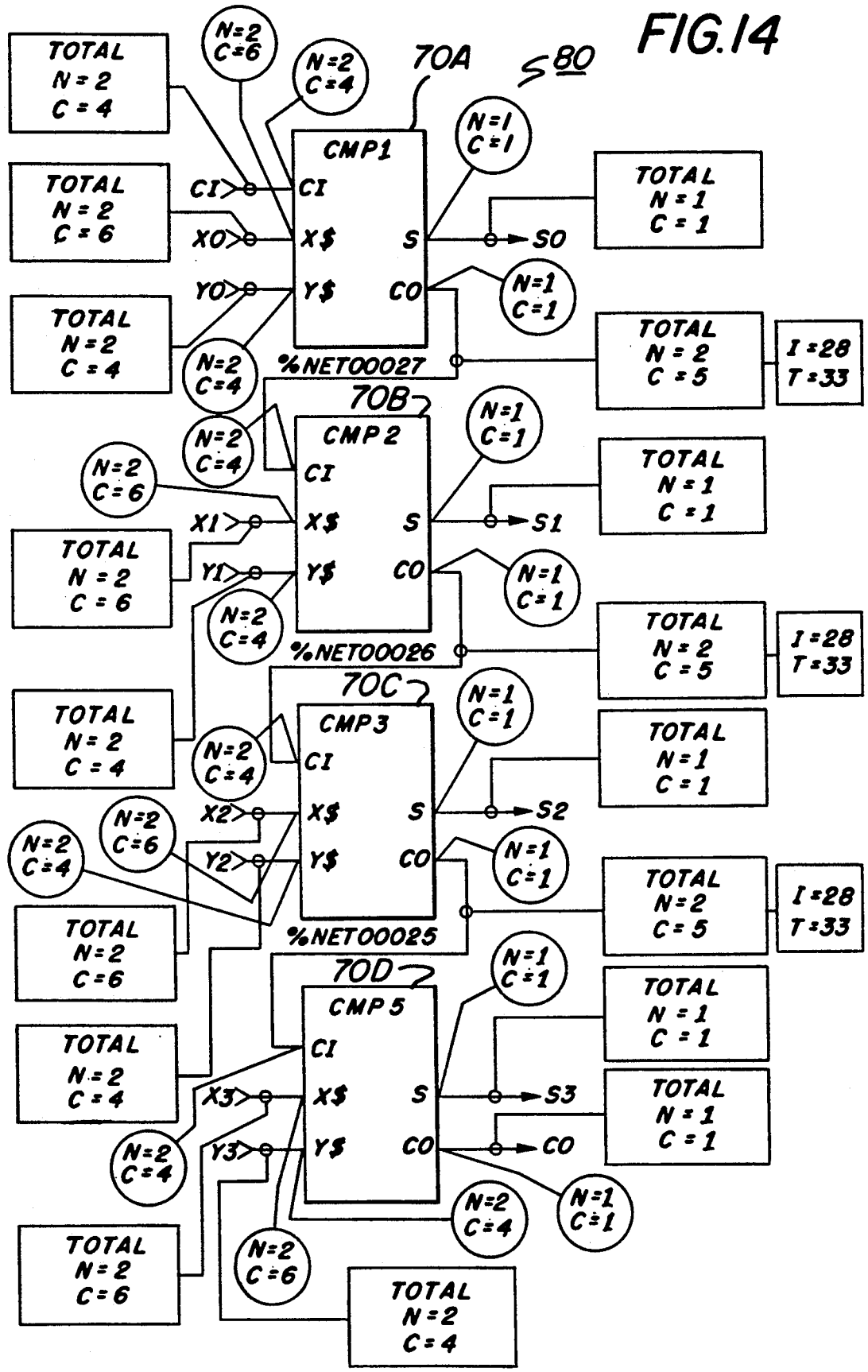
Figure 15:
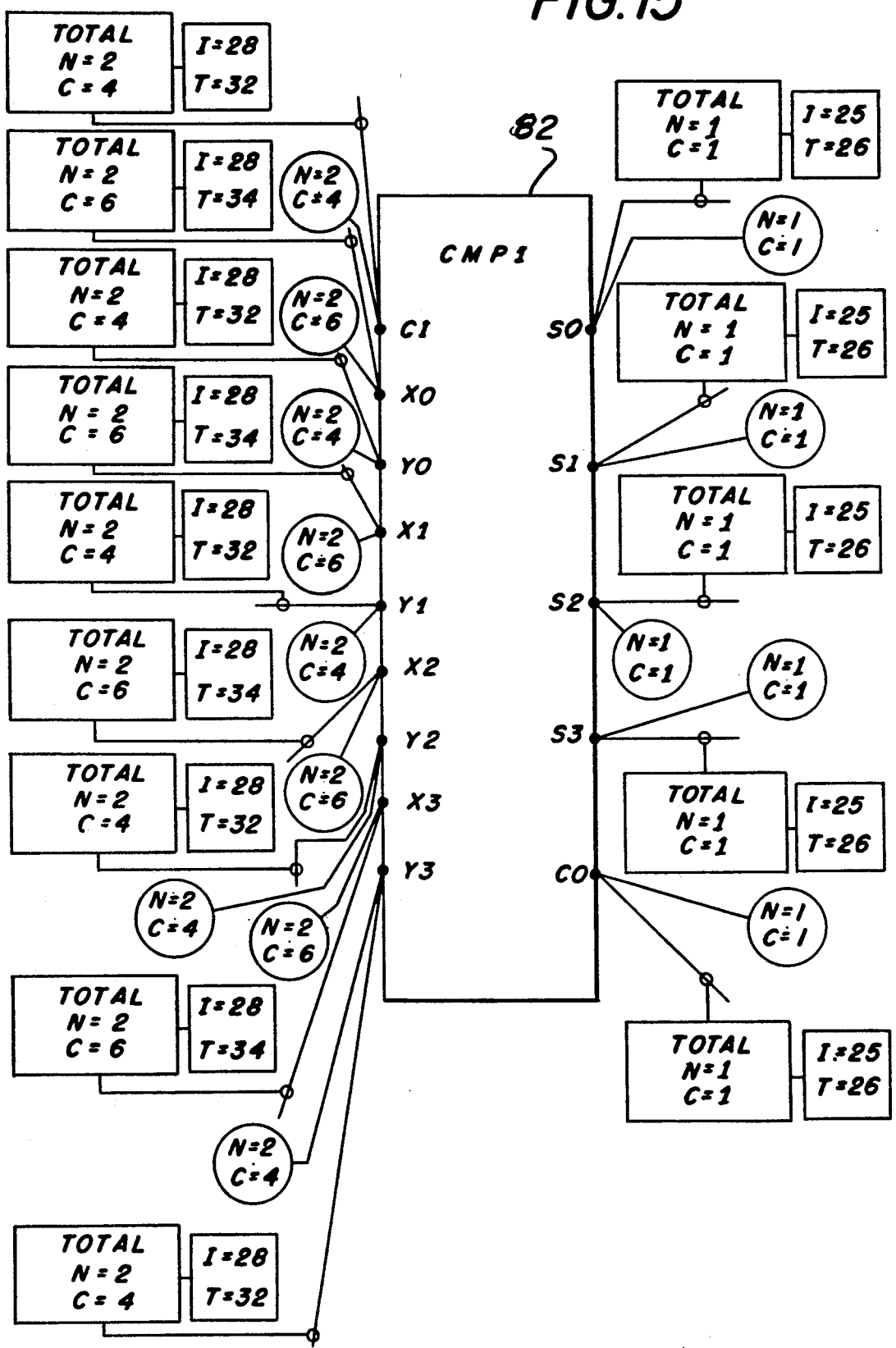

The pin capacitances for leaf ports are predefined. The connection count of any leaf port is defined to be 1. In FIG. 12, HALF ADDER block 60 is shown with all component ports marked with a connection count N and pin capacitance C. For each net, the total connection count N and pin capacitance C is shown. The master ports X, Y, S, and C inherit the attributes of the associated nets inside the block. FIG. 13 shows the computation for FULL ADDER block 70. Note that the ports of both HALF ADDER instances 60A, 60B are labeled with the attributes inherited from HALF ADDER 60. FIGS. 14 and 15 show the computation for FOUR BIT ADDER 80 and ROOT 82.

3. Intrinsic Capacitance

FIGS. 12 through 15 also show the intrinsic capacitance I and the total capacitance T. In the example, I is a function of N and gate count G of the enclosing block. This function is exemplary, and is typically implemented by a lookup table. For simplicity, it will be assumed that $I = 3 \times N + G \div 4$. The total capacitance T is defined as $T = C + I$. Note that only I and T are computed for internal nets. These values are not defined for external nets (ports) because they must be inherited from the outer nets to which they are connected, and those are specific to particular instances of the block. During synthesis, only values which are not instance-specific are computed.

B. Analysis

Analysis is the process of recursively traversing the design hierarchy from the top-down in order to compute component-specific information. The analysis process starts at the root block of the design hierarchy. As the design hierarchy is descended, a "pathname" is constructed which is the sequence of local component identifiers denoting a path from the root block to the particular instance being processed. The pathname starts off at the root block as the null sequence.

In addition to the pathname, the analysis process maintains another important piece of information during the top-down traversal. When it reaches a particular instance of a block, it remembers the attributes of the nets connected to all ports of the instance. It collects this information whenever it processes a component. Any net attributes can be carried down in this way, but only T (total capacitance) will be carried down in this example, since that is the only attribute which affects the computation of output pin delay.

Referring to FIG. 15, the analysis begins with ROOT block 82, containing a single component. Each component port is connected to an internal net, so each outer port attribute T is equal to the T of the internal net. This is always the case for the root block: (since the root block has no ports, all of its nets are internal). Next, the local component identifier "CMP1" is attached to the pathname (currently null), resulting in [CMP1]. Since the component is an instance of FOUR BIT ADDER block 80, we call analysis recursively on that block, passing in the outer port attributes for the component.

Figure 16:
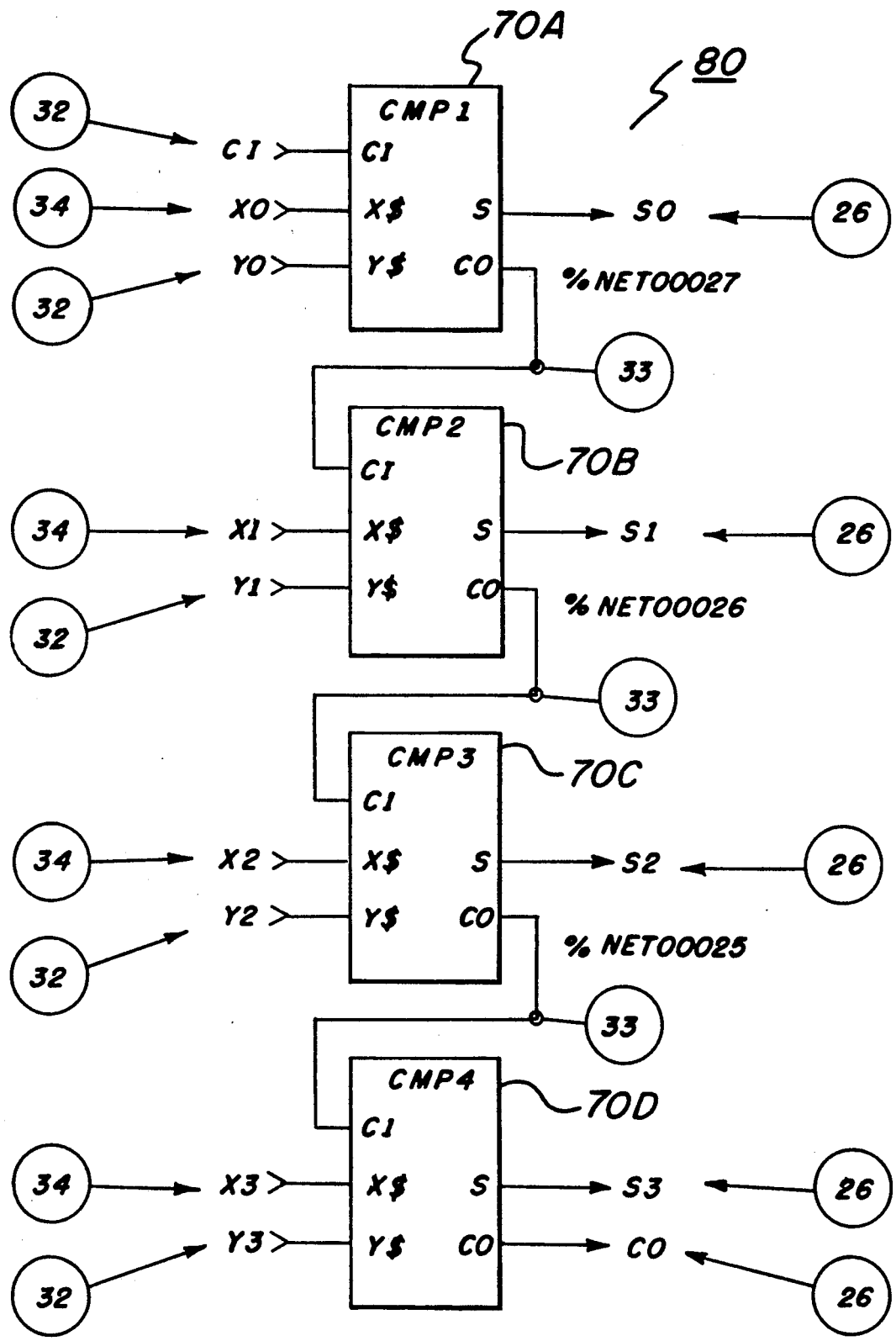

FIG. 16 shows the new situation. The analysis is currently "at" an instance of FOUR BIT ADDER 80 whose name is the path [CMP1]. The outer port attributes T are noted on the external nets. The internal nets have the T values that were synthesized earlier (see FIG. 13). Each component port takes its outer T attribute from the connected net. For each of the 4 components 70A, 70B, 70C, 70D (corresponding to "CMP1", "CMP2" "CMP3" and "CMP4", respectively) their associated outer port attributes are gathered and analysis is recursively performed. Only the analysis for FULL ADDER block 70B ("CMP2") will be shown. First, the label CMP2 is added to the pathname, resulting in [CMP1, CMP2]. Next, analysis on FULL ADDER block 70B is performed.

Figure 17:
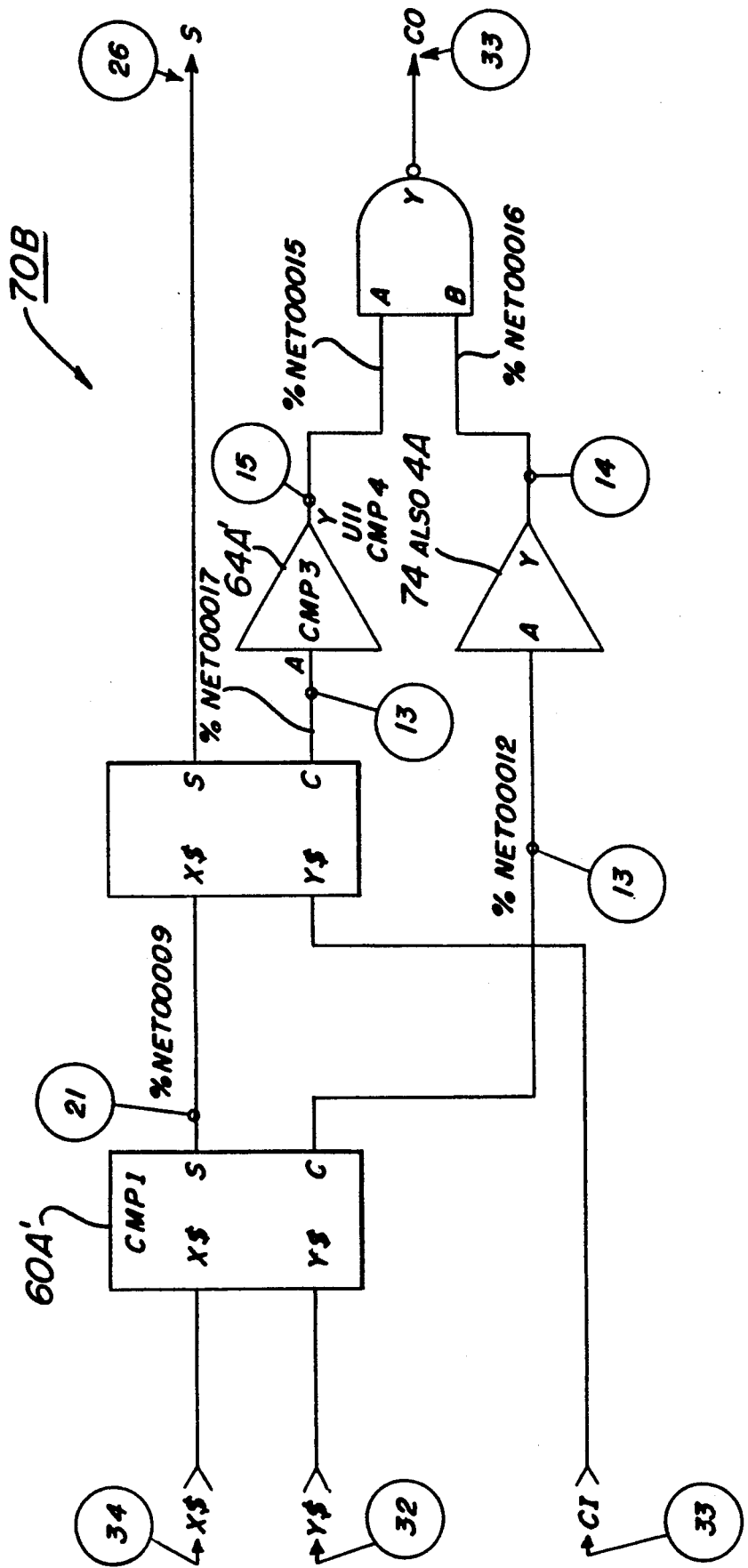

FIG. 17 shows the new situation. The analysis is currently at an instance of HALF ADDER 70B whose name is the path [CMPI, CMP2]. The outer port attributes T inherited from [CMP1] are noted on the external nets. The analysis algorithm will visit all 5 components, but only the analysis of the HALF ADDER instance 60A' named "CMP1" and the INVERTER instance 64A' named "CMP3" will be shown.

Figure 18:
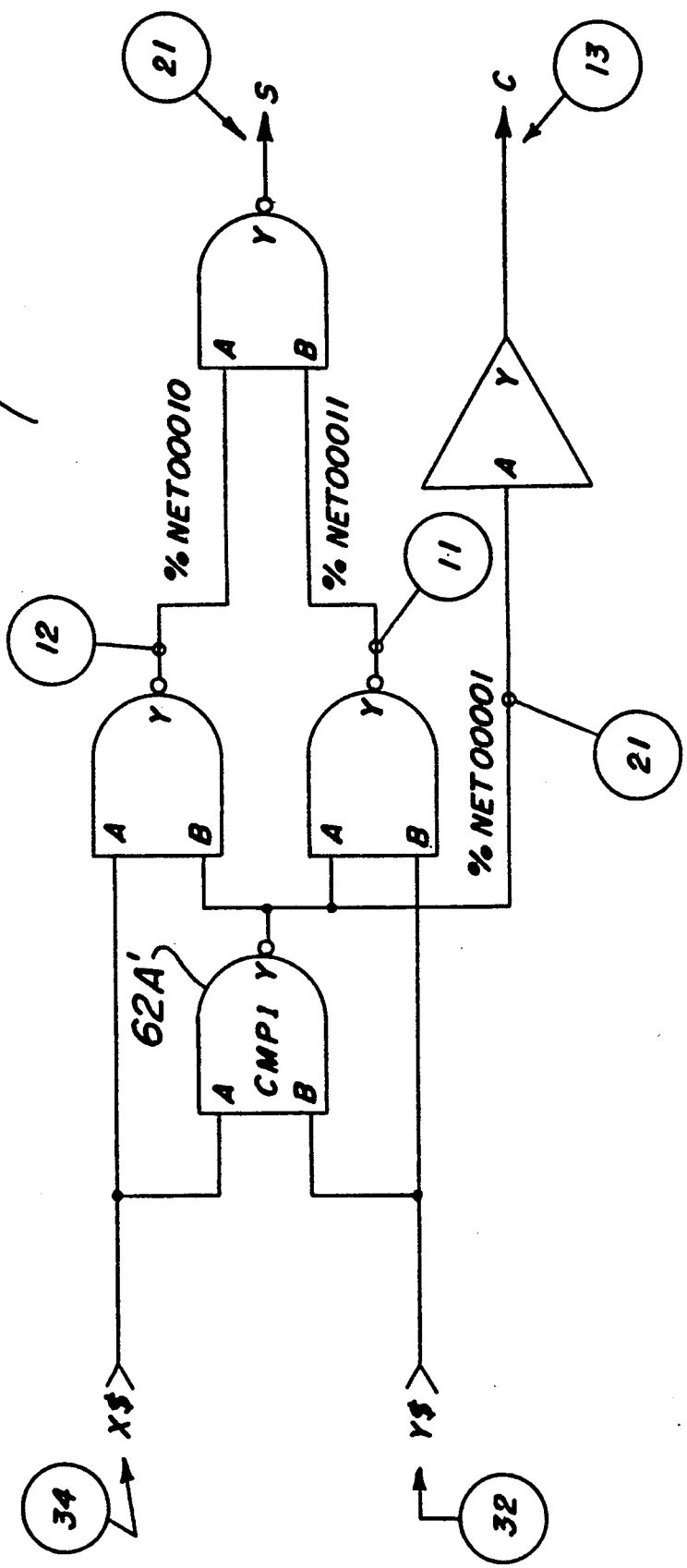
Figure 19:
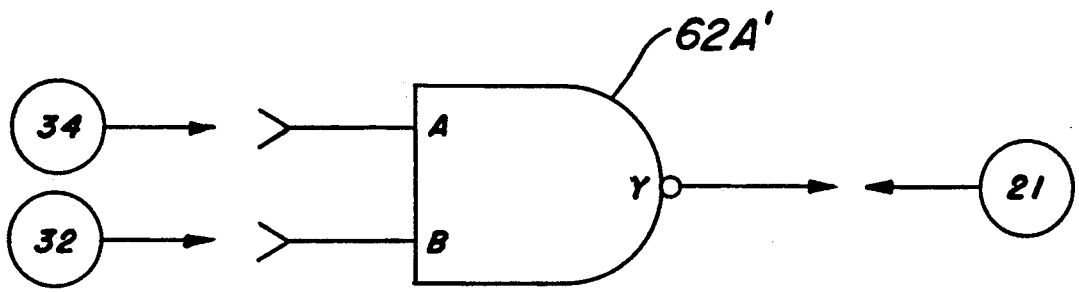

HALF ADDER 60A' is entered, leaving the analysis at block 62A' [CMP1, CMP2, CMP1] shown in FIG. 18. Descending into NAND instance 62A' (CMP1) leaves the analysis at FIG. 19. At this point, an instance of a leaf block has been reached, and delay estimation is performed for the [CMP1, CMP2, CMP1, CMP1] block 62A'. Note that technique of collecting outer port attributes has made all the necessary capacitance information available for estimation. Any kind of "contextual" information can be carried down in this fashion. Taken to an extreme, the analysis process could be tailored into a design "flattener" by bringing down full pathnames of nets instead of just capacitances.

The analysis pops back up into HALF ADDER block 60A' (FIG. 18) and processes the other components. Here, all of the components are leaf blocks, so delay estimation is performed for these components. Note that because a design hierarchy must be acyclic, there is always at least one nonleaf block whose components are all leaf blocks. In this case, it is the HALF ADDER 60.

Figure 20:
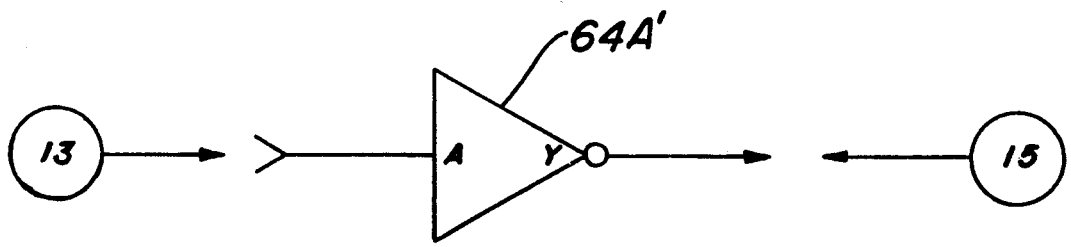

The algorithm next pops back up into FULL ADDER 70B (FIG. 17) and analyzes block 64A' (CMP3). FIG. 20 shows the new instance [CMPI, CMP2, CMP3]. Since INVERTER 64A' is a leaf block, delay estimation is performed for this instance. Note that this particular instance is interesting in that all of its ports are connected to internal nets. Thus, the delay calculations performed on this instance are independent of the outer capacitances on the external nets of the enclosing FULL ADDER instance 70B. In effect, these calculations are not instance-specific, i.e., they are context-free.

In summary, a data structure and corresponding analysis method for logically representing and processing a hierarchical circuit design have been described. Although particular embodiments have been discussed, many variations thereof can be envisioned which are within the scope of the invention. Accordingly, the scope of the invention is intended to be precisely defined and limited only by the appended claims.

What is claimed is:

1. In a computer aided engineering system, a method of determining at least one parameter associated with a hierarchical circuit design, the hierarchical circuit having at least one nonleaf component, the nonleaf component having at least one leaf component, and each component having at least one input port and one output port, the method comprising the steps of:

(a) constructing a data structure representing the hierarchical circuit design, each nonleaf component of the circuit represented in the data structure by a block of data, each block of data comprising (1) a list of ports of the nonleaf component, (2) a list of components composing said nonleaf component, and (3) a partitioned list of ports of said components composing said nonleaf component, said partitioned list of ports being partitioned into classes representing nets to which said ports are connected;

(b) synthesizing, based at least upon the data structure constructed in step (a), a list of attributes associated with each block in the design;

(c) analyzing, based at least upon the list of attributes synthesized in step (b), the data structure and determining said parameter; and (d) providing an indication of the result of step (c).

2. Method of claim 1 wherein said parameter to be determined is a delay parameter associated with each leaf component.

3. Method of claim 2 wherein step (b) further comprises:

(i) determining a gate count ("$G_L$") for each leaf component represented in the data structure;

(ii) calculating a gate count ("$G_{NL}$") for each nonleaf component represented in the data structure;

(iii) determining a connection count ("$N_L$") and pin capacitance ("$C_L$") for each port of each leaf component represented in the data structure;

(iv) calculating a connection count ("$N_{NL}$") and pin capacitance ("$C_{NL}$") for each net represented in the data structure;

(v) determining a connection count ("$N_{NPL}$") and pin capacitance ("$C_{NLP}$") for each port of each nonleaf component represented in the data structure;

(vi) determining an intrinsic capacitance ("I") for each net represented in the data structure; and (vii) determining a total capacitance ("T") for each net represented in the data structure.

4. Method of claim 3 wherein $G_L$ is predefined.

5. Method of claim 3 wherein $G_{NL}$ for each nonleaf component is equal to the sum of the gate counts $G_L$ of all leaf components listed in the block for which the synthesis is to be performed.

6. Method of claim 3 wherein the connection count $N_L$ and pin capacitance $C_L$ for each port of each leaf block is predefined.

7. Method of claim 3 wherein the connection count $N_{NL}$ for each net is equal to the sum of the connection counts $N_L$ of all ports connected to the net for which $N_{NL}$ is to be calculated.

8. Method of claim 3 wherein the pin capacitance $C_{NL}$ for each net is equal to the sum of the pin capacitances $C_L$ of all ports connected to the net for which $C_{NL}$ is to be calculated.

9. Method of claim 3 wherein the pin capacitance $C_{NLP}$ for each port of each nonleaf component is equal to the pin capacitance $C_{NL}$ of a net associated with that port.

10. Method of claim 3 wherein the connection count $N_{NLP}$ for each port of each nonleaf component is equal to the connection count $N_{NL}$ of a net associated with that port.

11. Method of claim 3 wherein the intrinsic capacitance I of each internal net is a function of at least the values of $N_{NL}$ and $G_{NL}$ associated with that net.

12. Method of claim 3 wherein the total capacitance T of each net is equal to the sum of $C_{NL}$ and I associated with that net.

13. Method of claim 2 wherein step (c) further comprises:

(i) determining an attribute ("T") associated with each port of each nonleaf component represented by the data structure; and (ii) determining the attribute T associated with each net and port represented in the data structure.

14. Method of claim 13 wherein T represents the total capacitance.

15. Method of claim 13 wherein step (c) further comprises:

(iii) determining a delay parameter associated with an output port of each leaf component represented in the data structure.

16. Method of claim 15 wherein step (iii) comprises:

(1) determining a maximum capacitance ("$C_i$") of any net connected to an input port of at least one leaf component;

(2) determining a capacitance ("$C_o$") of an output port of the leaf component for which $C_i$ was determined in step (1); and (3) calculating the delay parameter associated with the output port for which $C_o$ was determined in step (2), said delay parameter being a function of at least $C_o$ and $C_i$.

17. In a computer aided engineering system, a method of determining at least one parameter associated with a hierarchical circuit design, the hierarchical circuit having at least one nonleaf component, the nonleaf component having at least one leaf component, and each component having at least one input port and one output port, the method comprising the steps of:

(a) constructing a data structure representing the hierarchical circuit design, each nonleaf component of the circuit represented in the data structure by a block of data, each block of data comprising (1) a list of ports of the nonleaf component, (2) a list of components composing said nonleaf component, and (3) a partitioned list of ports of said components composing said nonleaf component, said partitioned list of ports being partitioned into classes representing nets to which said ports are connected;

(b) synthesizing, based at least upon the data structure constructed in step (a), a list of attributes associated with each block in the design, the synthesis comprising:

(i) determining a gate count ("$G_L$") for each leaf component represented in the data structure;

(ii) calculating a gate count ("$G_{NL}$") for each nonleaf component represented in the data structure;

(iii) determining a connection count ("$N_L$") and pin capacitance ("$C_L$") for each port of each leaf component represented in the data structure;

(iv) calculating a connection count ("$N_{NL}$") and pin capacitance ("$C_{NL}$") for each net represented in the data structure;

(v) determining a connection count ("$N_{NPL}$") and pin capacitance ("$C_{NLP}$") for each port of each nonleaf component represented in the data structure;

(vi) determining an intrinsic capacitance ("I") for each net represented in the data structure; and (vii) determining a total capacitance ("T") for each net represented in the data structure;

(c) analyzing, based at least upon the list of attributes synthesized in step (b), the data structure and determining said parameter; and (d) providing an indication of the result of step (c).

18. Method of claim 17 wherein $G_L$ is predefined.

19. Method of claim 17 wherein $G_{NL}$ for each nonleaf component is equal to the sum of the gate counts $G_L$ of all leaf components represented by the block for Which the synthesis is to be performed.

20. Method of claim 17 wherein the connection count $N_L$ and pin capacitance $C_L$ associated with each port of each leaf component is predefined.

21. Method of claim 17 wherein the connection count $N_{NL}$ for each net is equal to the sum of the connection counts $N_L$ of all ports connected to the net for which $N_{NL}$ is to be calculated.

22. Method of claim 17 wherein the pin capacitance $C_{NL}$ associated with each net is equal to the sum of the pin capacitances $C_L$ of all ports connected to the net for which $C_{NL}$ is to be calculated.

23. Method of claim 17 wherein the pin capacitance $C_{NLP}$ associated with each port of each nonleaf component is equal to the pin capacitance $C_{NL}$ of a net associated with that port.

24. Method of claim 17 wherein the connection count $N_{NLP}$ associated with each port of each nonleaf block is equal to the connection count $N_{NL}$ of a net associated with that port.

25. Method of claim 17 wherein the intrinsic capacitance I of each internal net is a function of at least the values of $N_{NL}$ and $G_{NL}$ associated with that net.

26. Method of claim 17 wherein the total capacitance T of each net is equal to the sum of $C_{NL}$ and I associated with that net.

27. In a computer aided engineering system, a method of determining a delay parameter associated with a hierarchical circuit design, the hierarchical circuit having at least one nonleaf component, the nonleaf component having at least one leaf component, and each component having at least one input port and one output port, the method comprising the steps of:

(a) constructing a data structure representing the hierarchical circuit design, each nonleaf component of the circuit represented in the data structure by a block of data, each block of data comprising (1) a list of ports of the nonleaf component, (2) a list of components composing said nonleaf component, and (3) a partitioned list of ports of said components composing said nonleaf component, said partitioned list of ports being partitioned into classes representing nets to which said ports are connected;

(b) synthesizing, based at least upon the data structure constructed in step (a), a list of attributes associated with each block in the design;

(c) analyzing, based at least upon the list of attributes synthesized in step (b), the data structure and determining said delay parameter, the analysis comprising:

(i) determining an attribute ("T") associated with each port of each nonleaf component represented by the data structure; and (ii) determining the attribute T associated with each net and port represented in the data structure; and (d) providing an indication of the result of step (c).

28. Method of claim 27 wherein T represents the total capacitance.

29. Method of claim 27 wherein step (c) further (iii) determining a delay delay parameter associated with each output port of each leaf component.

30. Method of claim 29 wherein step (iii) comprises:

(1) determining a maximum capacitance ("$C_i$") of any net connected to any input port of at least one leaf component;

(2) determining a capacitance ("$C_o$") of an output port of the leaf component for which $C_i$ was determined in step (1); and (3) calculating the delay parameter associated with the output port for which $C_o$ was determined in step (2), said delay parameter being a function of at least $C_o$ and $C_i$.

31. In a computer aided engineering system, a method of determining a delay parameter associated with a hierarchical circuit design, the hierarchical circuit having at least one nonleaf component, the nonleaf component having at least one leaf component, and each component having at least one input port and one output port, the method comprising the steps of:

(a) constructing a data structure representing the hierarchical circuit design, each nonleaf component of the circuit represented in the data structure by a block of data, each block of data comprising (1) a list of ports of the nonleaf component, (2) a list of components composing said nonleaf component, and (3) a partitioned list of ports of said components composing said nonleaf component, said partitioned list of ports being partitioned into classes representing nets to which said ports are connected;

(b) synthesizing, based at least upon the data structure constructed in step (a), a list of attributes associated with each block in the design, the synthesis comprising:

(i) determining a gate count ("$G_L$") for each leaf component represented in the data structure;

(ii) calculating a gate count ("$G_{NL}$") for each nonleaf component represented in the data structure;

(iii) determining a connection count ("$N_L$") and pin capacitance ("$C_L$") for each port of each leaf component represented in the data structure;

(iv) calculating a connection count ("$N_{NL}$") and pin capacitance ("$C_{NLP}$") for each net represented in the data structure;

(v) determining a connection count ("$N_{NPL}$") and pin capacitance ("$C_{NLP}$") for each port of each nonleaf component represented in the data structure;

(vi) determining an intrinsic capacitance ("I") for each net represented in the data structure; and (vii) determining a total capacitance ("T") for each net represented in the data structure;

(c) analyzing, based at least upon the list of attributes synthesized in step (b), the data structure and determining said delay parameter, the analysis comprising:

(i) determining an attribute ("T") associated with each port of each nonleaf component represented by the data structure; and (ii) determining the attribute T associated with each net and port represented in the data structure; and (d) providing an indication of the result of step (c).

32. Method of claim 31 wherein $G_L$ is predefined.

33. Method of claim 31 wherein $G_{NL}$ associated with each nonleaf component is equal to the sum of the gate counts $G_L$ of all leaf components represented by the block for which the synthesis is to be performed.

34. Method of claim 31 wherein the connection count $N_L$ and pin capacitance $C_L$ for each port of each leaf component is predefined.

35. Method of claim 31 wherein the connection count $N_{NL}$ for each net is equal to the sum of the connection counts $N_L$ of all ports connected to the net for which $N_{NL}$ is to be calculated.

36. Method of claim 31 wherein the pin capacitance $C_{NL}$ for each net is equal to the sum of the pin capacitances $C_L$ of all ports connected to the net for which $C_{NL}$ is to be calculated.

37. Method of claim 31 wherein the pin capacitance $C_{NLP}$ for each port of each nonleaf component is equal to the pin capacitance $C_{NL}$ of a net associated with that port.

38. Method of claim 31 wherein the connection count $N_{NLP}$ for each port of each nonleaf component is equal to the connection count $N_{NL}$ of a net associated with that port.

39. Method of claim 31 wherein the intrinsic capacitance I is a function of at least the values of $N_{NL}$ and $G_{NL}$ associated with the net for which I is to be determined.

40. Method of claim 31 wherein the total capacitance T of each net is equal to the sum of $C_{NL}$ and I associated with that net.

41. Method of claim 31 wherein step (c) further comprises:
 (iii) determining a delay delay parameter associated with each output port of each leaf component.

42. Method of claim 41 wherein step (iii) comprises:
 (1) determining a maximum capacitance ("$C_i$") of any net connected to an input port of at least
 (2) determining a capacitance ("$C_o$") of an output port of the leaf component for which $C_i$ was determined in step (1); and
 (3) calculating the delay parameter associated with the output port for which $C_o$ was determined in step (2), said delay parameter being a function of at least $C_o$ and $C_i$.

43. Method of claim 31 wherein the data structure constructed in step (a) further comprises: (4) a list of types indicative of the respective functions performed by the components comprising the nonleaf block.

* * * * *